(12) United States Patent
Teng

(10) Patent No.: US 9,190,971 B2
(45) Date of Patent: Nov. 17, 2015

(54) THRESHOLD CROSSING DETECTION

(75) Inventor: Robert Hwat Hian Teng, Zurich (CH)

(73) Assignee: ST-ERICSSON SA, Plan-les-Ouates (CH)

( * ) Notice: Subject to any disclaimer, the term of this patent is extended or adjusted under 35 U.S.C. 154(b) by 855 days.

(21) Appl. No.: 13/504,708

(22) PCT Filed: Oct. 29, 2010

(86) PCT No.: PCT/EP2010/006620
§ 371 (c)(1),
(2), (4) Date: Apr. 27, 2012

(87) PCT Pub. No.: WO2011/050975
PCT Pub. Date: May 5, 2011

(65) Prior Publication Data
US 2012/0215547 A1     Aug. 23, 2012

(30) Foreign Application Priority Data

Oct. 30, 2009 (EP) .................................... 09252520

(51) Int. Cl.
*G10L 19/00* (2013.01)
*H03G 1/00* (2006.01)
*G01R 19/175* (2006.01)
*H03G 3/30* (2006.01)
*H03K 5/1536* (2006.01)

(52) U.S. Cl.
CPC ............ *H03G 1/0088* (2013.01); *G01R 19/175* (2013.01); *H03G 3/3026* (2013.01); *H03K 5/1536* (2013.01)

(58) Field of Classification Search
CPC ............................... G10L 19/00; G10L 19/025
USPC .................................................. 704/500, 225
See application file for complete search history.

(56) References Cited

U.S. PATENT DOCUMENTS

| 4,070,632 A | 1/1978 | Tuttle |
| 4,528,519 A * | 7/1985 | van Driest ..................... 330/279 |
| 6,388,500 B1 * | 5/2002 | Lee et al. ....................... 327/337 |
| 2003/0179016 A1 | 9/2003 | Fujiwara |
| 2011/0260038 A1 * | 10/2011 | Hirotsu et al. ............. 250/208.1 |

FOREIGN PATENT DOCUMENTS

| GB | 2 307 121 A | 5/1997 |
| JP | 60-206209 | 10/1985 |

(Continued)

OTHER PUBLICATIONS

Japanese Office Action in corresponding Japanese Application No. 2012-535683 mailed Jul. 29, 2014.
International Search Report issued in corresponding International application No. PCT/EP2010/006620, mailed Feb. 17, 2011.

(Continued)

*Primary Examiner* — Qi Han
(74) *Attorney, Agent, or Firm* — Patent Portfolio Builders PLLC

(57) ABSTRACT

A signal processing apparatus comprises a signal path for a signal, the signal path comprising a signal processing stage. An auxiliary stage is coupled to an input of the signal processing stage for, in response to a signal in the signal path at the input of the signal processing stage, generating a control signal indicative of the time of a crossing of a first threshold by the signal in the signal path at an output of the signal processing stage by detecting a crossing by the signal of a second threshold established by the auxiliary stage. The second threshold is substantially equal to the first threshold.

11 Claims, 5 Drawing Sheets

(56) References Cited

FOREIGN PATENT DOCUMENTS

| | | |
|---|---|---|
| JP | 2006-041734 A | 2/2006 |
| JP | 2009-105887 A | 5/2009 |
| JP | 2009-153007 A | 7/2009 |
| JP | 2009-201044 A | 9/2009 |

OTHER PUBLICATIONS

Written Opinion issued in corresponding International application No. PCT/EP2010/006620, mailed Feb. 17, 2011.
European Search Report issued in corresponding European application No. 09 25 2520, completed Apr. 16, 2010.

* cited by examiner

THRESHOLD CROSSING DETECTION

FIELD OF THE DISCLOSURE

The present disclosure relates to a signal processing apparatus and method for detecting a threshold crossing of a signal and is applicable, for example but not exclusively, to gain control of an audio signal in a mobile communications device or portable personal music player.

BACKGROUND TO THE DISCLOSURE

In audio equipment, the gain of an audio signal is typically controlled in steps. However, a step in gain can result in an abrupt change in the audio signal, which can result in an undesired audible click. In other equipment where gain is controlled, a similar problem can arise with non-audio signals where gain is controlled, as a change in gain can introduce an undesired disturbance or distortion into the signal.

One way of addressing this problem is to implement the change of gain when the signal is zero. This involves the detection of zero crossings in a signal. An example of such as scheme is illustrated in FIG. 1.

Referring to FIG. 1, a signal processing apparatus has a variable gain stage 10 which has an input 12 for a signal to be processed. An output of the variable gain stage 10 is coupled to an input 22 of a signal processing stage 20, and the signal processing stage 20 has an output 24 for the signal after it has been processed by the variable gain stage 10 and the signal processing stage 20. The variable gain stage 10 has an input 14 for a control signal which it employs to determine when to adjust the gain applied to the signal. A zero crossing detector 30 has an input coupled to the output 24 of the signal processing stage 20 for detecting when the signal is zero. The zero crossing detector 30 generates the control signal and has an output coupled to the input 14 for delivering the control signal to the variable gain stage 10.

The zero crossing detector 30 may employ a comparator to determine whether the signal is above or below a reference level. For a signal processing apparatus operating from first and second supply voltages $V_{DD}$, $V_{SS}$, the reference level may be ideally the average of the supply voltages, $(V_{DD}+V_{SS})/2$. For example, if the supply voltages $V_{DD}$, $V_{SS}$ are equal in magnitude and opposite in polarity, the reference level may be ideally zero, and if one of the supply voltages $V_{SS}$ is zero, the reference level may be ideally half the other of the supply voltages, $V_{DD}/2$. Any error in the level detected will affect the time at which the gain is adjusted. For example, if the zero crossing detector 30 has a detection threshold that is too high, a downward crossing would be detected too early and an upwards crossing would be detected too late. Conversely, if the zero crossing detector 30 has a detection threshold that is too low, a downward crossing would be detected too late and an upwards crossing would be detected too early. The magnitude of the timing error depends on the gradient of the signal at the crossing. The zero crossing detector 30 can be designed to have a very low DC offset, but such a design is costly in terms of silicon area and power consumption.

There is a requirement for improved threshold crossing detection.

SUMMARY OF THE PREFERRED EMBODIMENTS

According to a first aspect, there is provided a signal processing apparatus comprising:

a signal path for a signal, the signal path comprising a signal processing stage; and an auxiliary stage coupled to an input of the signal processing stage for, in response to a signal in the signal path at the input of the signal processing stage, generating a control signal indicative of the time of a crossing of a first threshold by the signal in the signal path at an output of the signal processing stage by generating an indication of a time of a crossing by the signal of a second threshold established by the auxiliary stage, wherein the second threshold is substantially equal to the first threshold.

According to a second aspect, there is provided a method of signal processing in a signal processing apparatus comprising a signal path for a signal, the signal path having a signal processing stage, the method comprising:

generating, in response to a signal in the signal path at the input of the signal processing stage, a control signal indicative of the time of a crossing of a first threshold by the signal in the signal path at an output of the signal processing stage by generating an indication of a time of a crossing by the signal of a second threshold established by the auxiliary stage, wherein the second threshold is substantially equal to the first threshold.

Therefore, in response to the signal at the input of the signal processing stage, the auxiliary stage generates an indication of the time at which the signal at the output of the signal processing stage crosses the first threshold by detecting when the signal crosses a second threshold established by the auxiliary stage. Such a scheme is tolerant of the first and second thresholds being non-zero, and therefore reduces design constraints as it does not require a threshold crossing detection circuit to have a threshold of very close to zero.

Optionally, the first threshold can be equal to a DC level at the output of the signal processing stage in the absence of the signal in the signal path and the second threshold can be equal to a DC level established by the auxiliary stage in the absence of the signal in the signal path. This feature can enable the first and second threshold to be established in a simple manner.

Optionally, the signal processing stage can comprise a first amplifier for establishing the first threshold and the auxiliary stage can comprise a second amplifier for establishing the second threshold, wherein the second amplifier is a copy of the first amplifier. Likewise, the method can optionally comprise providing a first amplifier for establishing the first threshold and providing a second amplifier for establishing the second threshold, wherein the second amplifier is a copy of the first amplifier. This feature can enable the first and second thresholds to be determined in a simple and accurate manner, thereby enabling the control signal to be generated in a simple and accurate manner.

Optionally, the signal processing stage can comprise a feedback path for operating the first amplifier with feedback, and the second amplifier can be arranged to be operated without feedback. Likewise, the method can optionally comprise operating the first amplifier with feedback, and operating the second amplifier without feedback. This feature can enable linear amplification of the signal in the signal path and non-linear amplification in the auxiliary stage, thereby facilitating generation of the control signal in a simple and accurate manner. By the use of non-linear amplification, the control signal can be generated simply and accurately with a fast slew rate, which facilitates the use of low power digital circuitry for processing the control signal, without a stringent requirement on the switching threshold of the digital circuitry.

Optionally, the feedback path couples the output of the signal processing apparatus to the signal path at a location preceding the input of the signal processing stage. Likewise, the method can optionally comprise coupling the feedback path between the output of the signal processing apparatus and a location in the signal path preceding the input of the signal processing stage. This feature enables the auxiliary stage to generate the control signal dependent on a signal in the signal path and within a feedback loop formed by the feedback path and the signal path, thereby enabling improved threshold crossing detection.

Optionally, the first amplifier can comprise at least one first transistor, and the second amplifier can comprise at least one second transistor. Likewise, the method can optionally comprise providing the first amplifier with at least one first transistor, and the second amplifier with at least one second transistor. The at least one second transistor may have at least one physical dimension which is a scaled down copy of at least one physical dimension of the at least one first transistor. The feature can enable the second amplifier to establish the second threshold substantially equal to the first threshold whilst consuming less power than the first amplifier.

Optionally, the at least one first transistor can comprise a first p-channel metal oxide semiconductor transistor and a first n-channel metal oxide semiconductor transistor with their gates coupled to an input of the first amplifier and their drains coupled to an output of the first amplifier, and the at least one second transistor can comprise a second p-channel metal oxide semiconductor transistor and a second n-channel metal oxide semiconductor transistor with their gates coupled to an input of the second amplifier and their drains coupled to an output of the second amplifier. The feature can enable a simple implementation of the first amplifier and the second amplifier.

Optionally, the signal processing apparatus can comprise a variable gain stage for adjusting the amplitude of the signal in the signal path in response to the control signal. Likewise, the method can optionally comprise adjusting the amplitude of the signal in the signal path in response to the control signal. This feature enables a change of gain to be synchronised with the occurrence of a threshold crossing at the output of the signal processing stage, thereby enabling a change of gain to be made with little impact on the signal at the output of the signal processing stage.

The signal processing apparatus can comprise power conservation means for disabling at least part of the auxiliary stage between adjustments of the amplitude of the signal in the signal path. Likewise, the method can optionally comprise conserving power by disabling at least part of the auxiliary stage between adjustments of the amplitude of the signal in the signal path. This enables power consumption to be reduced between gain adjustments.

BRIEF DESCRIPTION OF THE DRAWINGS

Preferred embodiments will now be described, by way of example only, with reference to the accompanying drawings, in which.

DETAILED DESCRIPTION OF PREFERRED EMBODIMENTS

Figure 1:
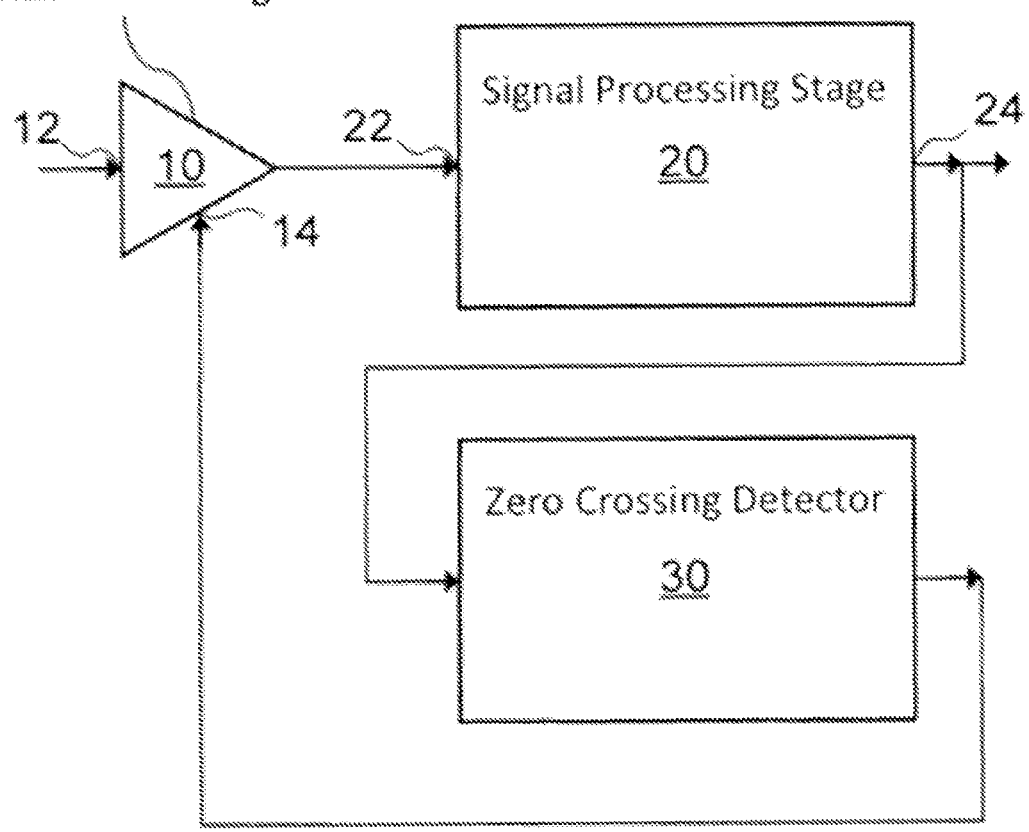
FIG. 1 is a block diagram of a prior art signal processing apparatus.
Figure 2:
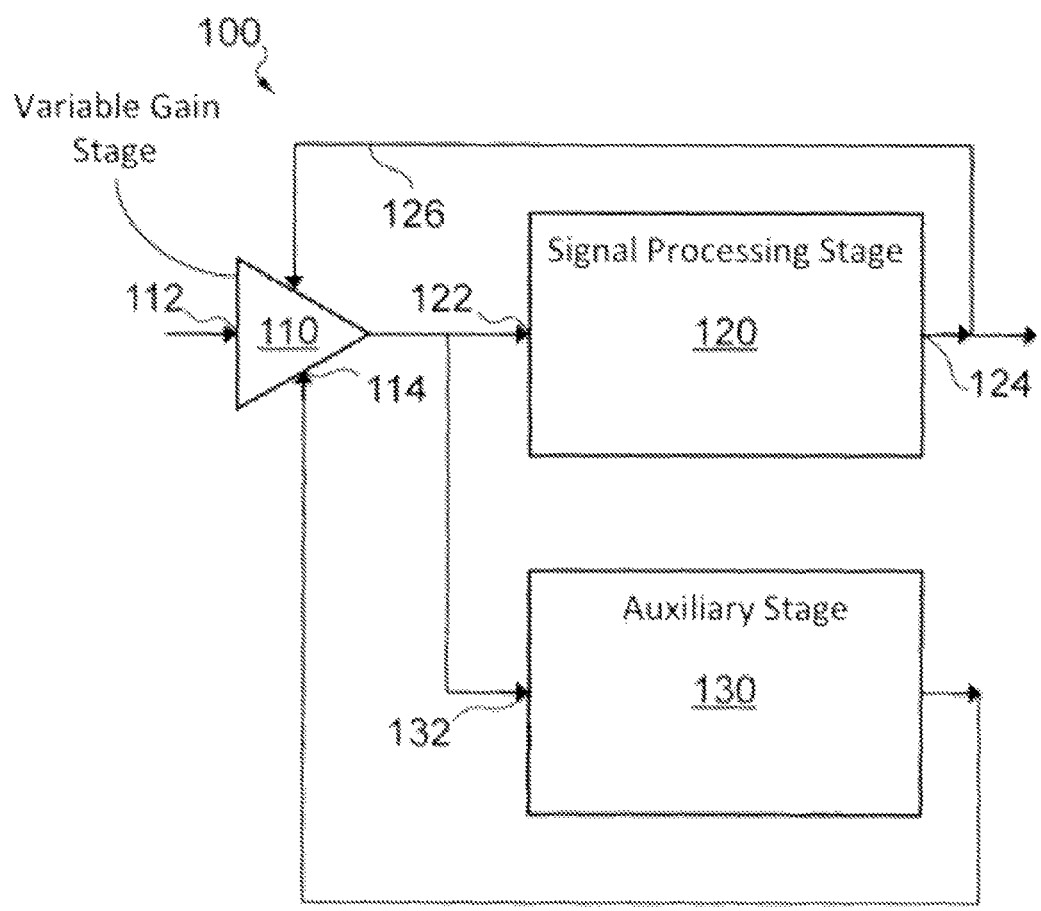
FIG. 2 is a block diagram of a signal processing apparatus according to a first preferred embodiment.

Referring to FIG. 2, a signal processing apparatus 100 according to a first preferred embodiment has a variable gain stage 110 which has an input 112 for a signal to be processed by the signal processing apparatus 100. An output of the variable gain stage 110 is coupled to an input 122 of a signal processing stage 120, and the signal processing stage 120 has an output coupled to the output 124 of the signal processing apparatus 100 for the signal after it has been processed by the variable gain stage 110 and the signal processing stage 120. Therefore, the signal processing apparatus 100 comprises a signal path from the input 112 of the signal processing apparatus 100 to the output 124 of the signal processing apparatus 100 through the variable gain stage 110 and the signal processing stage 120. The signal path may include additional, non-illustrated elements preceding the variable gain stage 110, and/or between the variable gain stage 110 and the signal processing stage 120, and/or following the signal processing stage 120. There is a feedback path 126 coupling the output 124 of the signal processing apparatus 100 to the signal path in the variable gain stage 110.

The variable gain stage 110 may determine itself that a gain adjustment is required, whether the gain should be increased or decreased, and also the magnitude of the gain adjustment, or the variable gain stage 110 may have a non-illustrated input for receiving an indication of these parameters. The variable gain stage 110 has an input 114 for a control signal which it employs to determine the timing of a gain adjustment.

An auxiliary stage 130 has an input coupled to the input 122 of the signal processing stage 120. The auxiliary stage 130 generates the control signal and has an output coupled to the input 114 of the variable gain stage 110 for delivering the control signal to the variable gain stage 110. Although the auxiliary stage 130 receives the signal, being coupled to the input 122 of the signal processing stage 120, it does not deliver the signal at its output after processing and is not considered to be part of the signal path.

In the absence of a signal in the signal path, the signal path is at a quiescent DC level. Due to circuit imperfections, the quiescent DC level may be different in different regions of the signal path, dependent on DC offsets introduced by different elements along the signal path, and the optimum time at which to adjust the gain in the signal path is dependent on the region where the detrimental effect of an abrupt change of gain is to be suppressed. In particular, in order to avoid an abrupt change in the signal at the output 124 of the signal processing stage 120, which, for an audio signal, may cause an undesired click, the gain of the variable gain stage 110 should ideally be changed when the signal at the output 124 of the signal processing apparatus 100 crosses the quiescent DC level at that output 124. The quiescent DC level at that output 124 is referred to as the first threshold. If the auxiliary stage 130 were to be coupled to the output 124 of the signal processing apparatus 100, instead of to the input 122 of the signal processing stage 120, the auxiliary stage 130, in order to not introduce any significant perturbation to the detected crossing time, would be required to have a detection threshold closely matched to the quiescent DC level at that point and should not introduce any additional DC offset. However, an auxiliary stage with zero DC offset is costly in terms of silicon area and power.

In the signal processing apparatus of FIG. 2, the auxiliary stage 130 is, instead, coupled to the input 122 of the signal processing stage 120, and it detects the crossing of a second threshold, where the second threshold is arranged in the auxiliary stage 130 to be substantially equal to the first threshold. In this arrangement, it is not necessary for the auxiliary stage 130 to provide zero DC offset, and instead it can have a DC offset the same as, or similar to, that of the signal processing stage 120. In this way, the auxiliary stage 130 can generate a control signal indicative of the time of a crossing of the first threshold by the signal in the signal path at the output 124 of the signal processing apparatus 100 without being coupled to that output 124.

Figure 3:
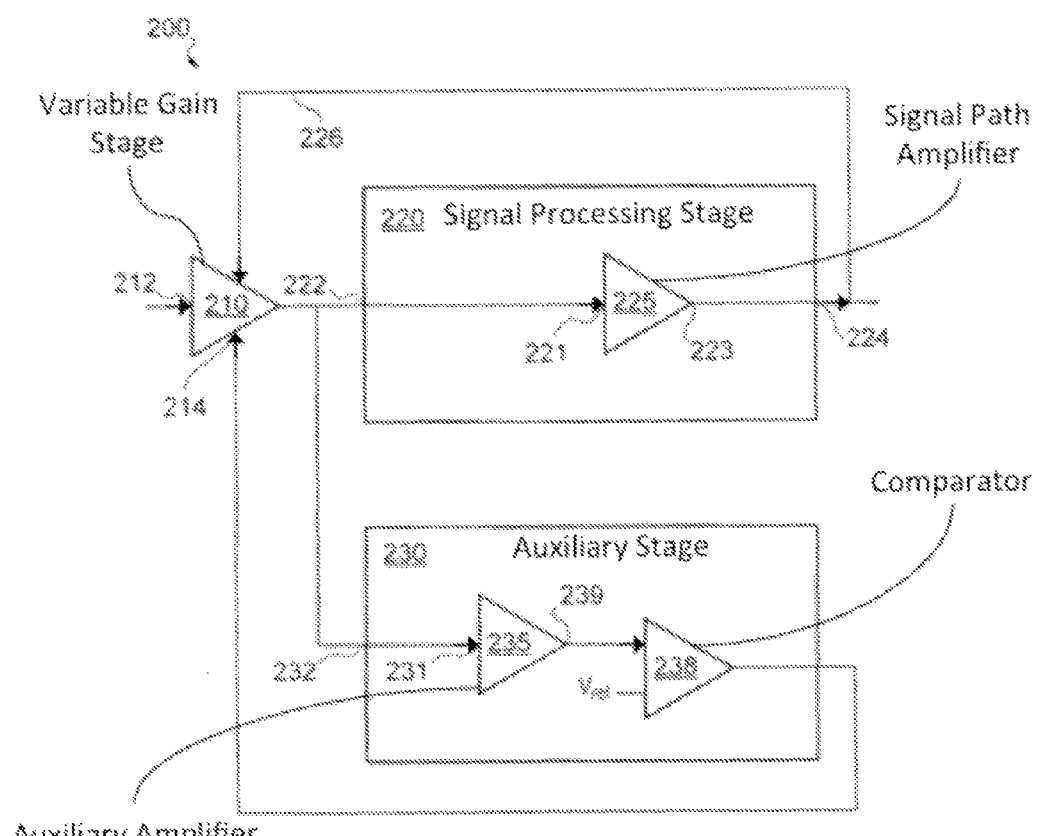
FIG. 3 is a block diagram of a signal processing apparatus according to a second preferred embodiment.

Further details will be described with reference to FIG. 3, which illustrates a signal processing apparatus 200 according to a second preferred embodiment. Referring to FIG. 3, the signal processing apparatus 200 of the second preferred embodiment has a variable gain stage 210 that has an input 212 for a signal to be processed. An output of the variable gain stage 210, which delivers the signal after processing by the variable gain stage 210, is coupled to an input 222 of a signal processing stage 220. The signal processing stage 220 has an output coupled to the output 224 of the signal processing apparatus 200 for the signal after it has been processed by the variable gain stage 210 and the signal processing stage 220. Therefore, the signal processing apparatus 200 comprises a signal path from the input 212 of the signal processing apparatus 200 to the output 224 of the signal processing apparatus 200 through the variable gain stage 210 and the signal processing stage 220. The signal path can include additional, non-illustrated elements preceding the variable gain stage 210, and/or between the variable gain stage 210 and the signal processing stage 220, and/or following the signal processing stage 220. There is a feedback path 226 coupling the output 224 of the signal processing apparatus to the signal path in the variable gain stage 210.

The variable gain stage 210 may determine itself that a gain adjustment is required, whether the gain should be increased or decreased, and also the magnitude of the gain adjustment, or the variable gain stage 210 may have a non-illustrated input for receiving an indication of these parameters. The variable gain stage 210 has an input 214 for a control signal which it employs to determine the timing of a gain adjustment.

There is an auxiliary stage 230 having an input 232 coupled to the input 222 of the signal processing stage 220. The auxiliary stage 230 generates the control signal and has an output coupled to the input 214 of the variable gain stage 210 for delivering the control signal to the variable gain stage 210. Although the auxiliary stage 230 receives the signal, being coupled to the input 222 of the signal processing stage 220, it does not deliver the signal at its output after processing and is not considered to be part of the signal path.

The signal processing stage 220 comprises a signal path amplifier 225 having an output 223 coupled to the output 224 of the signal processing apparatus 200 and an input 221 coupled to the input 222 of the signal processing stage 220. The signal path amplifier 225 has an internal gain, and the feedback path 226 and the signal path amplifier 225 in combination define the overall gain of the signal processing stage 220, the overall gain of the signal processing stage 220 including the feedback being lower than the internal gain of the signal path amplifier 225, and the signal processing stage 220 providing linear amplification of the signal in the signal path.

The description above of the operation of the signal processing apparatus 100 illustrated in FIG. 2 for the variable gain stage 110, signal processing stage 120 and the auxiliary stage 130 is also applicable to the signal processing apparatus 200 illustrated in FIG. 3 for the corresponding variable gain stage 210, signal processing stage 220 and auxiliary stage 230.

The auxiliary stage 230 of the second preferred embodiment has an auxiliary amplifier 235, this being a copy of the signal path amplifier 225. The auxiliary amplifier 235 has an input 231 coupled to the input 232 of the auxiliary stage 230 and an output 239 coupled to a first input of a comparator 238. The comparator 238 also has a second input for a reference voltage $V_{ref}$. An output of the comparator 238 is coupled the output of the auxiliary stage 230.

The auxiliary amplifier 235 is not provided with feedback, and so amplifies with a gain equal to the internal gain of the auxiliary amplifier 235, which is relatively high. This causes limiting of the signal passing through the auxiliary amplifier 235, such that the signal at the output 239 of the auxiliary amplifier 235 is substantially a two-level signal having fast transitions between supply voltage rails of the auxiliary amplifier 235. The transitions are indicative of whether the signal at the input 231 of the auxiliary amplifier 235 is above or below a quiescent DC level in the auxiliary amplifier 235, that is the second threshold, this being the quiescent DC level in the auxiliary amplifier 235 in the absence of a signal at the input 212 of the signal processing apparatus 200. Because the auxiliary amplifier 235 is a copy of the signal path amplifier 225, the DC offset level of the auxiliary amplifier 235 is substantially equal to the DC offset level of the signal path amplifier 225, and therefore the second threshold is substantially equal to the first threshold.

The comparator 238 functions as a buffer to provide the control signal in a binary format suitable for use by the variable gain stage 210, but may be omitted if the signal at the output 239 of the auxiliary amplifier 235 is suitable for use directly by the variable gain stage 210. In an alternative embodiment, the comparator 238 may be replaced by a digital inverter, which does not need the reference voltage $V_{ref}$. The control signal is therefore indicative of whether the signal at the output of the auxiliary amplifier 235 is above or below the quiescent DC level that would be present at the output 224 of the signal processing apparatus 200 in the absence of a signal at the input 212 of the signal processing apparatus 200. Because signal at the output of the auxiliary amplifier 235 is a substantially two-level signal with fast transitions, it is not essential for the comparator 238 to have a low DC offset or for the voltage reference $V_{ref}$ to have a precise value as deviations in these voltages will not cause a time shift in the transitions of the control signal.

Under ideal operating conditions, in order to avoid introducing abrupt changes into the signal at the output 224 of the signal processing apparatus 200, the time of the change of gain in the variable gain stage 210 should coincide with the time of a transition in the control signal, and therefore coincide with the time at which the signal at the output 224 of the signal processing apparatus 200 crosses the quiescent DC level at that output 224. However, in practice there is likely to be a finite delay between the detection of a crossing and the change of the gain. Nevertheless, it is desirable to synchronise changes of gain with the time of the crossing in the signal, even though the synchronisation may not provide coincidence, and to minimise the delay between the detection of a crossing and the change of the gain.

Figure 4:
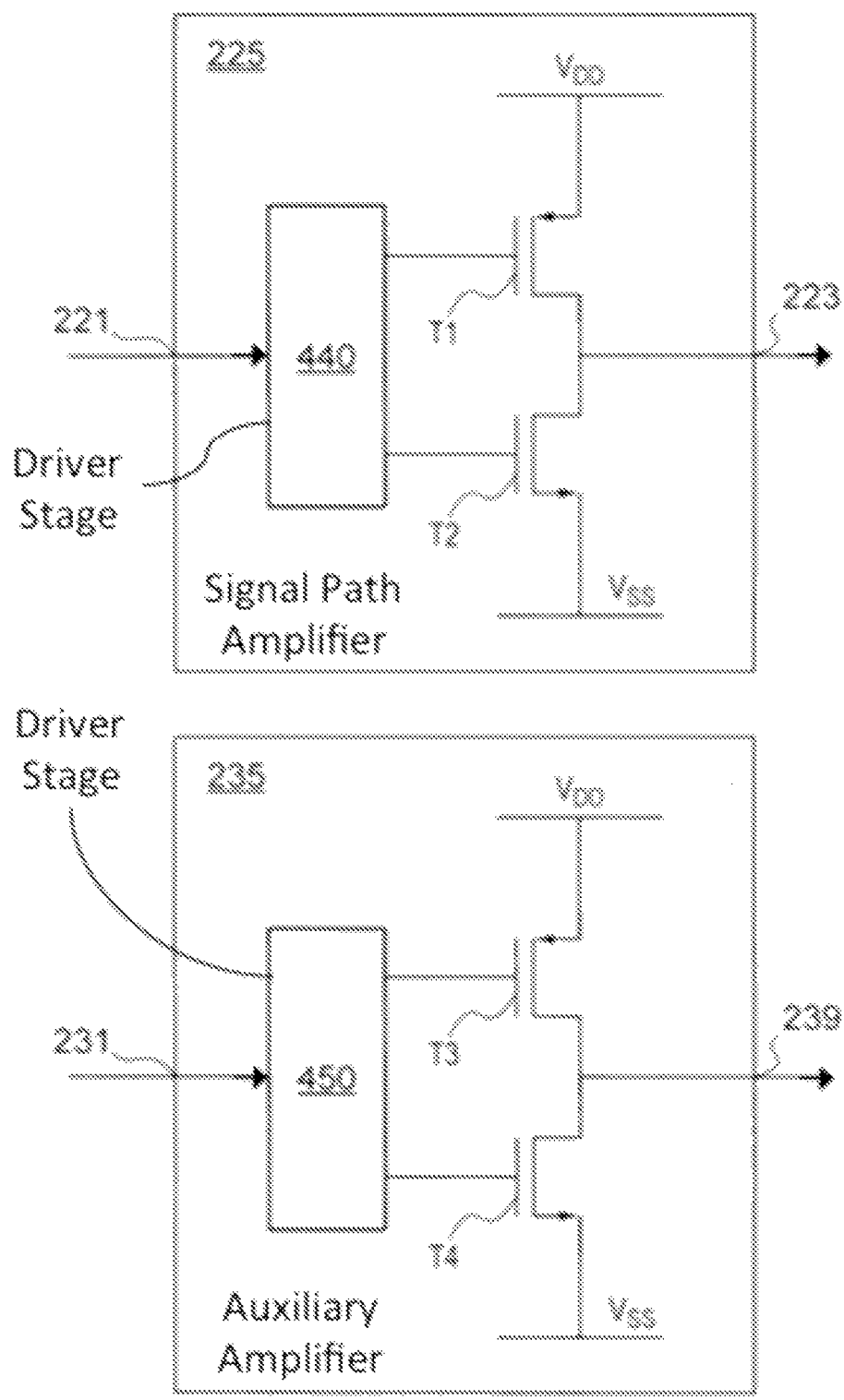
FIG. 4 is a schematic diagram of an amplifier and a copy of the amplifier.

FIG. 4 provides more detail about the signal path amplifier 225 and the auxiliary amplifier 235. The signal path amplifier 225 comprises a p-channel metal oxide semiconductor (PMOS) transistor T1 and an n-channel metal oxide semiconductor (NMOS) transistor T2 having their drains coupled to the output 223 of the signal path amplifier 225. The signal at the input 221 of the signal path amplifier 225 is coupled to the gates of the transistors T1, T2 of the signal path amplifier 225 via a driver stage 440 which is part of the signal path amplifier 225 and which converts signals to a suitable form for driving the transistors T1, T2. Alternatively, driver circuitry may be external to the signal path amplifier 225. For example driver circuitry may be in the variable gain stage 210, or in the signal path between the variable gain stage 210 and the input 222 of the signal processing stage 220, in which case the driver circuitry may be common to both the signal path amplifier 225 and the auxiliary amplifier 235. The source of the PMOS transistor T1 is coupled to a first supply rail providing a first voltage $V_{DD}$, and the source of the NMOS transistor T2 is coupled to a second supply rail providing a relatively lower second voltage $V_{SS}$.

Likewise, the auxiliary amplifier 235 comprises a PMOS transistor T3 identical to the PMOS transistor T1 of the signal path amplifier 225, and an NMOS transistor T4 identical to the NMOS transistor T4 of the signal path amplifier 225, and which have their drains coupled to the output 239 of the auxiliary amplifier 235. The signal at the input 231 of the auxiliary amplifier 235 is coupled to the gates of the transistors T3, T4 of the auxiliary amplifier 235 via a driver stage 450 which is part of the auxiliary amplifier 235 and which converts signals to a suitable form for driving the transistors T3, T4. Alternatively, as in the case of signal path amplifier 225, driver circuitry may be external to the auxiliary amplifier 235. For example, as stated above, driver circuitry may be in the variable gain stage 210, or in the signal path between the variable stage 210 and the input 222 of the signal processing stage 220, in which case the driver circuitry may be common to both the auxiliary amplifier 235 and the signal path amplifier 235. The source of the PMOS transistor T3 of the auxiliary amplifier 235 is coupled to the first supply rail providing first voltage $V_{DD}$, and the source of the NMOS transistor T4 of the auxiliary amplifier 235 is coupled to the second supply rail providing the lower second voltage $V_{SS}$.

In operation, in the signal path amplifier 225, if the gate voltages of the transistors T1, T2 are driven such that the PMOS transistor T1 conducts more current than the NMOS transistor T2, then the excess current will flow from the signal path amplifier 225 to a load coupled to the output 224 of the signal processing apparatus 200. Conversely, if the gate voltages of the transistors T1, T2 of the signal path amplifier 225 are driven such that the NMOS transistor T2 conducts more current than the PMOS transistor T1, then the excess current will flow into the signal path amplifier 225 from the load coupled to the output 224 of the signal processing apparatus 200.

For the auxiliary amplifier 235 under the same drive conditions, but operated open loop without feedback and unloaded, or with a high impedance load, if the gate voltages of the transistors T3, T4 are driven such that the PMOS transistor T3 tries to conduct more current than the NMOS transistor T4, the drain-source voltage of the PMOS transistor T3 will be small and the voltage at the output 239 of the auxiliary stage 230 will be close to the first voltage $V_{DD}$. Conversely, if the gate voltages of the transistors T3, T4 of are driven such that the NMOS transistor T4 tries to conduct more current than the PMOS transistor T3, the drain-source voltage of the NMOS transistor T4 will be small and the voltage at the output 239 of the auxiliary stage 230 will be close to the second voltage $V_{SS}$. With good matching between the PMOS transistor T1 of the signal path amplifier 225 and the PMOS transistor T3 of the auxiliary amplifier 235, and with good matching between the NMOS transistor T2 of the signal path amplifier 225 and NMOS transistor T4 of the auxiliary amplifier 235, rising of the output 239 of the auxiliary amplifier 235 to the first voltage $V_{DD}$ is indicative of a current flowing out of the signal path amplifier 225 at the output 223 of the signal path amplifier 225, and falling of the output 239 of the auxiliary amplifier 235 to the second voltage $V_{SS}$ is indicative of a current flowing into the signal path amplifier 225 at the output 223 of the signal path amplifier 225.

Figure 5:
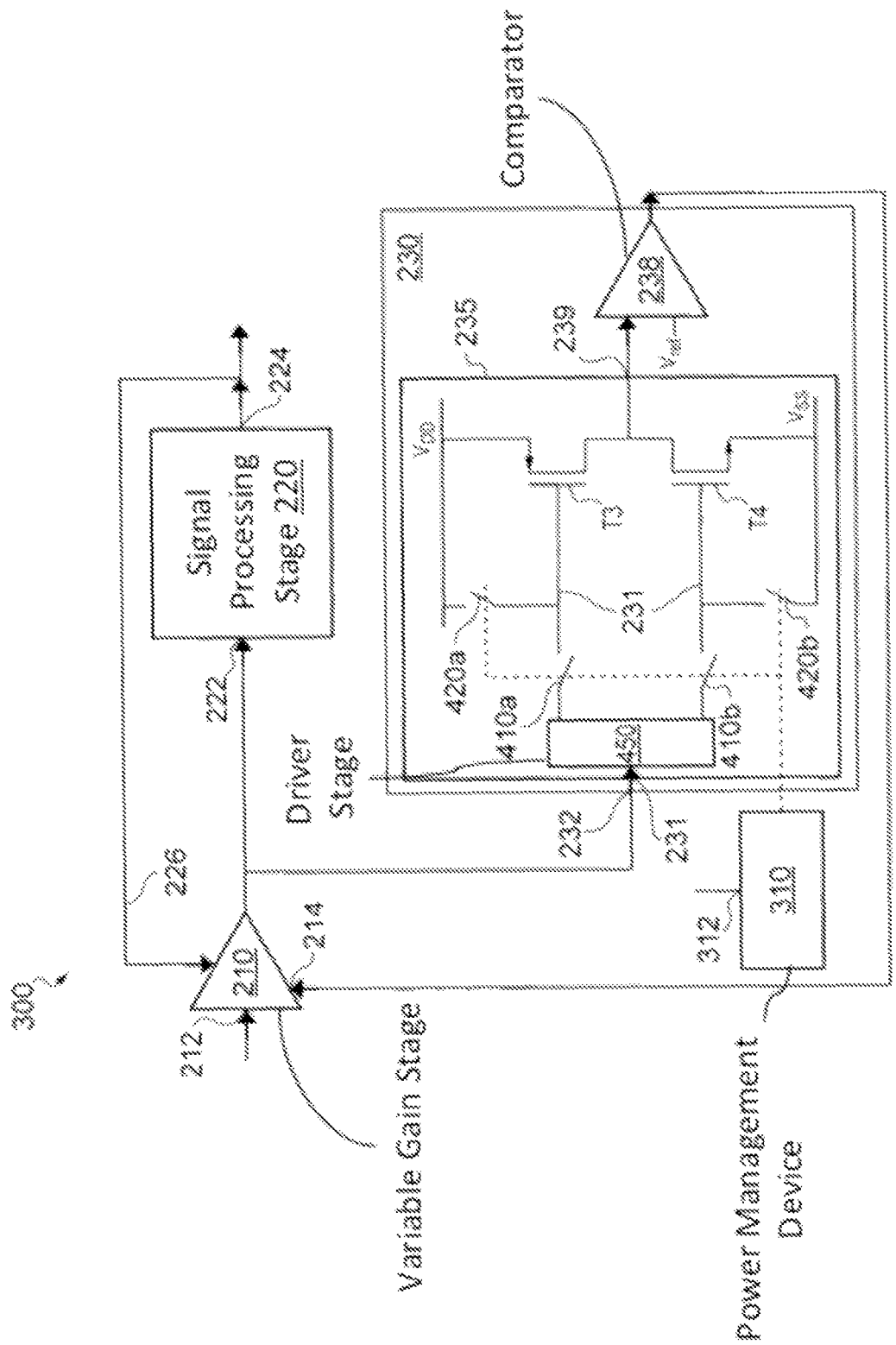
FIG. 5 is a block diagram of a signal processing apparatus with provision for power conservation.

FIG. 5 illustrates a signal processing apparatus 300 having provision for power conservation. Elements of FIG. 5 that are identical to elements of FIGS. 3 and 4 have the same reference numerals and are not described again. In particular, the auxiliary amplifier 235 illustrated in FIG. 4 is reproduced in the auxiliary stage 230 illustrated in FIG. 5, although it differs in that it includes additional switches. Coupled between the driver stage 450 of the auxiliary amplifier 235 and the respective gates of the transistors T3, T4 of the auxiliary amplifier 235 are the switches 410a and 410b for coupling and decoupling the input 231 of the auxiliary amplifier to/from the transistors T3, T4 of the auxiliary amplifier 235. There is a switch 420a for coupling and decoupling the gate of transistor T3 of the auxiliary amplifier 235 to/from the first supply rail providing the first voltage $V_{DD}$, and there is a switch 420b for coupling and decoupling the gate of transistor T4 of the auxiliary amplifier 235 to/from the second supply rail providing the second voltage $V_{SS}$.

Operation of the switches 410a, 410b, 420a, 420b is controlled by a power management device 310, and this control is represented by the dashed lines in FIG. 5. The power management device 310 has an input 312 for an indication of when a change of gain in the variable gain stage 210 is required. When a change of gain is required, the switches 410a and 410b are closed, thereby coupling the input 231 of the auxiliary amplifier 235 to the gates of the transistors T3, T4 of the auxiliary amplifier 235, and the switches 420a, 420b are opened, thereby decoupling the gates of the transistors T3, T4 of the auxiliary amplifier 235 from the first and second voltages $V_{DD}$, $V_{SS}$. In this state, operation of auxiliary stage 230 is as described above. When a change of gain has been completed or is not required, the switches 410a, 410b are opened, thereby decoupling the input 231 of the auxiliary amplifier 235 from the gates of the transistors T3, T4 of the auxiliary amplifier 235, and the switches 420a, 420b are closed, thereby coupling the gates of the transistors T3, T4 of the auxiliary amplifier 235 to the respective voltages $V_{DD}$, $V_{SS}$. In this state the transistors T3, T4 of the auxiliary amplifier 235 are in a non-conducting state and consume no power. The comparator 238 may similarly be deactivated when its operation is not required.

References to a DC level and to a DC offset may represent either a voltage or a current, that is a DC voltage level, a DC current level, a DC voltage offset or a DC current offset. Likewise, references to a quiescent DC level may represent either a quiescent DC voltage level or a quiescent DC current level, and the first and second thresholds may be either current thresholds or voltage thresholds.

Although embodiments have been described in which the second threshold is set to be substantially equal to the first threshold by employing for the auxiliary stage circuitry that is a copy of circuitry of the signal processing stage, this is not essential and other ways of setting the second threshold may be used. For example, the quiescent DC level at the output of the signal processing stage 120 could be compared with the quiescent DC level at the output of the auxiliary stage 130 in the absence of a signal, and the quiescent DC level in the auxiliary stage 130 adjusted accordingly.

Although embodiments have been described in which the signal processing apparatus 100, 200 comprises a variable gain stage preceding the signal processing stage 120, 220, this is not essential, and the gain adjustment can take place in any stage of the signal processing apparatus 100, 200, for example in the signal processing stage 120, 220.

Although embodiments have been described in which the feedback path 226 couples the output 224 of the signal processing apparatus 200, 300 to the signal path in the variable gain stage 210, this is not essential and instead the feedback path 226 may couple the output 224 of the signal processing apparatus 200, 300 to the signal path at any location preceding the input 222 of the signal processing stage 220.

Although embodiments have been described in which the auxiliary amplifier 235 is operated without feedback, that is open loop, this is not essential, and feedback may be employed.

Although embodiments have been described in which the auxiliary stage 230 comprises an auxiliary amplifier 235 which is a copy of the signal path amplifier 225 in the signal processing stage 220, the auxiliary amplifier 235 may be a scaled copy of the signal path amplifier 225, for example having the same operating voltages as the signal path amplifier 225, but having currents that are a scaled copy of the currents in the signal path amplifier 225. In particular, the transistors T3, T4 of the auxiliary amplifier 235 may have at least one physical dimension that is a scaled down copy of at least one physical dimension of the transistors T1, T2 of the signal path amplifier 225.

Although embodiments have been described in which the signal processing stage 220 comprises a signal path amplifier 225, the signal processing stage 220 may comprise an alternative or additional device, and provide processing other than, or additional to, amplification.

Although embodiments have been described in which the auxiliary amplifier 235 is a copy of the signal path amplifier 225, this is not essential. An alternative device which is not a copy, and which need not be an amplifier, may be employed in place of the auxiliary amplifier 235 for generating the control signal, provided that it can detect a crossing of the second threshold. For example, a comparator may be employed.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. A signal processing apparatus comprising:
    a signal path for a signal, the signal path comprising a signal processing stage and a variable gain stage for applying a gain to the signal in the signal path; and
    an auxiliary stage coupled to an input of the signal processing stage, to receive a signal in the signal path at the input of the signal processing stage, where the auxiliary stage has a threshold, and the auxiliary stage is operative to generate a control signal indicating crossing the threshold in the auxiliary stage by the signal, wherein the threshold is arranged in the auxiliary stage to be equal to a quiescent DC level at an output of the signal processing stage; and
    wherein the variable gain stage is arranged to receive the control signal and to determine timing of an adjustment to the gain applied to the signal in the signal path in response to the control signal.

2. A signal processing apparatus as claimed in claim 1, wherein the threshold is equal to a quiescent DC level established by the auxiliary stage.

3. A signal processing apparatus as claimed in claim 1, wherein the signal processing stage comprises a first amplifier for establishing the first threshold and the auxiliary stage comprises a second amplifier for establishing the second threshold, and wherein the second amplifier is a copy of the first amplifier.

4. A signal processing apparatus as claimed in claim 3, wherein the signal processing stage comprises a feedback path for operating the first amplifier with feedback, and wherein the second amplifier is arranged to be operated without feedback.

5. A signal processing apparatus as claimed in claim 4, wherein the feedback path couples the output of the signal processing apparatus to the signal path at a location preceding the input of the signal processing stage.

6. A signal processing apparatus as claimed in claim 3, wherein the first amplifier comprises at least one first transistor, and wherein the second amplifier comprises at least one second transistor having at least one physical dimension which is a scaled down copy of at least one physical dimension of the at least one first transistor.

7. A signal processing apparatus as claimed in claim 6, wherein the at least one first transistor comprises a first p-channel metal oxide semiconductor transistor and a first n-channel metal oxide semiconductor transistor with their gates coupled to an input of the first amplifier and their drains coupled to an output of the first amplifier, and wherein the at least one second transistor comprises a second p-channel metal oxide semiconductor transistor and a second n-channel metal oxide semiconductor transistor with their gates coupled to an input of the second amplifier and their drains coupled to an output of the second amplifier.

8. A signal processing apparatus as claimed in claim 1, comprising power conservation means for conserving power by disabling at least part of the auxiliary stage between adjustments of the amplitude of the signal in the signal path.

9. A method of signal processing in a signal processing apparatus comprising a signal path for a signal, the signal path having a signal processing stage and a variable gain stage for applying a gain to the signal in the signal path, the method comprising:
    receiving, in an auxiliary stage coupled to an input of the signal processing stage, a signal in the signal path at an input of the signal processing stage,
    generating a control signal indicating crossing of a threshold in the auxiliary stage, wherein the threshold is arranged in the auxiliary stage to be equal to a quiescent DC level at an output of the signal processing stage; and
    determining the timing of an adjustment to the gain applied to the signal in the variable gain stage of the signal path in response to the control signal.

10. The method as claimed in claim 9, wherein the signal processing stage comprises a first amplifier, where the quiescent DC level at the output of the signal processing stage is a quiescent DC level of the first amplifier, and the auxiliary stage comprises a second amplifier where the threshold in the auxiliary stage is a quiescent DC level of the second amplifier, and wherein the second amplifier is a copy of the first amplifier.

11. A signal processing apparatus comprising:
  a signal path for a signal, the signal path comprising a signal processing stage and a variable gain stage for applying a gain to the signal in the signal path; and
  an auxiliary stage coupled to an input of the signal processing stage to receive a signal in the signal path at the input of the signal processing stage, where the auxiliary stage has a threshold, and the auxiliary stage is operative to generate a control signal indicating crossing of the threshold in the auxiliary stage by the signal, wherein the signal processing stage comprises a first amplifier where the quiescent DC level at the output of the signal processing stage is a quiescent DC level of the first amplifier, and the auxiliary stage comprises a second amplifier where the threshold in the auxiliary stage is a quiescent DC level of the second amplifier, and wherein the second amplifier is a copy of the first amplifier; and
  where the variable gain stage is arranged to receive the control signal and to determine timing of an adjustment to the gain applied to the signal in the signal path in response to the control signal.

* * * * *